United States Patent
Garza

(10) Patent No.: US 12,406,192 B2
(45) Date of Patent: Sep. 2, 2025

(54) SERVICE LOCATION ANOMALIES

(71) Applicant: Landis+Gyr Innovations, Inc., Alpharetta, GA (US)

(72) Inventor: Carlos Iga Garza, Powhatan, VA (US)

(73) Assignee: Landis+Gyr Technology, Inc., Alpharetta, GA (US)

( * ) Notice: Subject to any disclaimer, the term of this patent is extended or adjusted under 35 U.S.C. 154(b) by 677 days.

(21) Appl. No.: 17/732,788

(22) Filed: Apr. 29, 2022

(65) Prior Publication Data
US 2022/0414484 A1  Dec. 29, 2022

Related U.S. Application Data

(60) Provisional application No. 63/216,375, filed on Jun. 29, 2021.

(51) Int. Cl.
*G06N 20/00* (2019.01)
*G01R 19/25* (2006.01)
(Continued)

(52) U.S. Cl.
CPC ......... *G06N 5/022* (2013.01); *G01R 19/2513* (2013.01); *G01R 31/086* (2013.01);
(Continued)

(58) Field of Classification Search
CPC .... G06N 5/022; G06N 20/00; G01R 19/2513; G01R 31/086; H02J 3/0012;
(Continued)

(56) References Cited

U.S. PATENT DOCUMENTS

| | | | | |
|---|---|---|---|---|
| 8,437,883 B2* | 5/2013 | Powell | ...................... | G05F 1/66 700/286 |
| 2014/0354295 A1* | 12/2014 | Magnusson | ............... | B60L 3/04 324/538 |

(Continued)

FOREIGN PATENT DOCUMENTS

| | | |
|---|---|---|
| EP | 3591786 A1 | 1/2020 |
| WO | 2019/195520 A1 | 10/2019 |

OTHER PUBLICATIONS

PCT Patent Application No. PCT/US2022/032344, International Search Report and Written Opinion, Oct. 21, 2022, 13 pages.

*Primary Examiner* — Catherine T. Rastovski
*Assistant Examiner* — Emma Alexander
(74) *Attorney, Agent, or Firm* — Kilpatrick Townsend & Stockton LLP

(57) ABSTRACT

Disclosed techniques include using machine learning to detect an electrical anomaly in a power distribution system. In an example, a method includes accessing voltage measurements measured at an electric metering device and over a time period. The method further includes calculating, from voltage measurements and for each time window of a set of time windows, a corresponding average voltage and a corresponding minimum voltage. The method further includes applying a machine learning model to the average voltages and the minimum voltages. The machine learning model is trained to identify one or more predetermined electrical anomalies from voltages. The method further includes receiving, from the machine learning model, a classification indicating an identified anomaly. The method further includes based on the classification, sending an alert to a utility operator.

18 Claims, 10 Drawing Sheets

(51) Int. Cl.
  *G01R 31/08* (2020.01)
  *G06N 5/022* (2023.01)
  *H02J 3/00* (2006.01)
  *H02J 13/00* (2006.01)

(52) U.S. Cl.
  CPC ...... *H02J 3/0012* (2020.01); *H02J 13/00002* (2020.01); *H02J 2203/20* (2020.01)

(58) Field of Classification Search
  CPC ............ H02J 13/00002; H02J 2203/20; H02J 13/00001; H02H 1/0092; H02H 3/24; H02H 5/10
  See application file for complete search history.

(56) References Cited

U.S. PATENT DOCUMENTS

2016/0077164 A1* 3/2016 Toyoshima ............ G01R 31/40
  702/58
2018/0100912 A1* 4/2018 Bell ..................... G01R 35/005

* cited by examiner

SERVICE LOCATION ANOMALIES

CROSS REFERENCE TO RELATED APPLICATIONS

This application claims the benefit of U.S. Provisional Application No. 63/216,375, filed Jun. 29, 2021, which is incorporated by reference in its entirety.

TECHNICAL FIELD

This application relates to using machine learning to detect abnormalities in power distribution systems.

BACKGROUND

Electric power is distributed to consumers via power distribution systems. Power distribution systems are complex and availability of power is important to customers. Therefore, anomalies in power distributions systems can increase downtime, wear on parts, and escalate service costs if left unrepaired. But adding additional equipment to a power distribution system to detect anomalies can be expensive. Hence, detection of anomalies in power distribution systems by using existing components such as electric meters is desired.

SUMMARY

Disclosed techniques include using machine learning to detect a electrical anomalies in a power distribution system. In an example, a method includes accessing voltage measurements measured at an electric metering device and over a time period. The method further includes calculating, from voltage measurements and for each time window of a set of time windows, a corresponding average voltage and a corresponding minimum voltage. The method further includes applying a machine learning model to the average voltages and the minimum voltages. The machine learning model is trained to identify one or more predetermined electrical anomalies from voltages. The method further includes receiving, from the machine learning model, a classification indicating an identified anomaly. The method further includes based on the classification, sending an alert to a utility operator.

In another example, a system for detecting an anomaly in a resource distribution system includes a head end system and electric metering devices. The head end system includes a computing device and a machine learning model. Each electric metering device includes a sensor. Each electric metering device is electrically connected to a distribution transformer that that is upstream of the respective electric metering device. Each electric metering device is configured to obtain a respective set of voltage measurements from the respective sensor of the electric metering device. Each electric metering device is configured to provide the respective set of voltage measurements to the head end system. The head end system includes a machine learning model. The head end system is configured to obtain, from each of the electric metering devices, the respective set of voltage measurements. The head end system is further configured to access a first set of voltage measurements measured at a first electric metering device. The head end system is further configured to calculate, from the first set of voltage measurements and for each of a first set of time windows, a first corresponding average voltage and a first corresponding minimum voltage. The head end system is further configured to apply a machine learning model to the first average voltages and the first minimum voltages. The machine learning model is trained to identify, from voltage measurements, a first voltage signature that corresponds to the electrical anomaly. The head end system is further configured to receive, from the machine learning model, a first classification indicating a first loose connection. The head end system can be further configured to send a first alert to a utility operator based on the first classification. The first alert identifies the first electric metering device. The head end system is further configured to access a second set of voltage measurements measured at a second electric metering device. The head end system is further configured to calculate, from the second set of voltage measurements and for each of a second set of time windows, a second corresponding average voltage and a second corresponding minimum voltage. The second set of time windows can occur before the first plurality of time windows. The head end system is further configured to apply the machine learning model to the first average voltages, the first minimum voltages, the second average voltages, and the second minimum voltages. The head end system is further configured to receive, from the machine learning model, a second classification identifying a second voltage signature indicating a second loose connection. The head end system is further configured to send a second alert to a utility operator based on the second classification. The second alert identifies the second electric metering device.

In another example, a method includes accessing a first set of voltage measurements measured at an electric metering device. The method further includes calculating, from the first set of voltage measurements and for each of a first set of time windows, a first corresponding average voltage and a first corresponding minimum voltage. The method further includes applying a machine learning model to the first average voltages and the first minimum voltages. The machine learning model is trained to identify, from voltage measurements, a first voltage signature that corresponds to the electrical anomaly. The method further includes receiving, from the machine learning model, a first classification indicating a first loose connection. The method further includes sending a first alert to a utility operator based on the first classification. The method further includes calculating, from a second set of voltage measurements and for each of a second set of time windows, a second corresponding average voltage and a second corresponding minimum voltage. The second set of time windows can occur before the first plurality of time windows. The method further includes applying the machine learning model to the first average voltages, the first minimum voltages, the second average voltages, and the second minimum voltages. The method further includes receiving, from the machine learning model, a second classification identifying a second voltage signature indicating a second loose connection. The method further includes sending a second alert to a utility operator based on the second classification.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Figure 1:
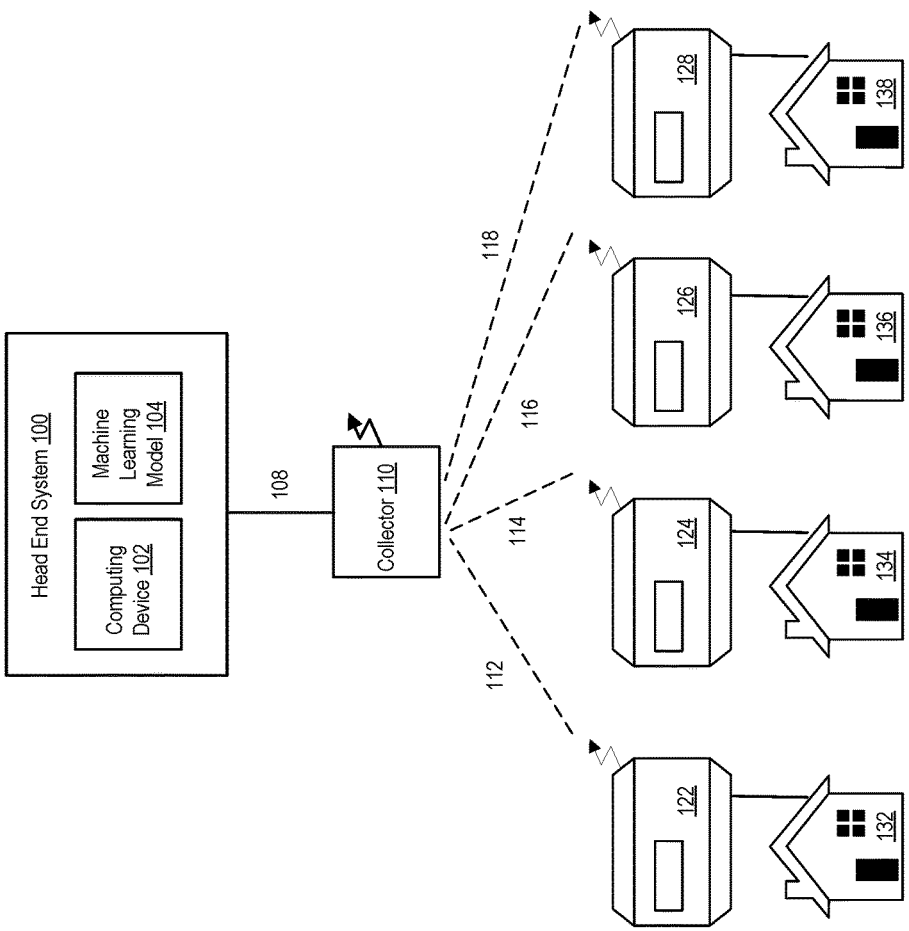
FIG. 1 illustrates an exemplary communication network topology of a power distribution system, in accordance with an aspect of the present disclosure.

Aspects of the present invention relate to using machine learning to detect electrical anomalies in electrical systems by learning and identifying voltage patterns, or signatures, in voltage measurements obtained by metering devices, or meters, located at end user premises. Anomalies can include, but are not limited to, a loose connection between a meter and a meter socket at an end user premises, a seasonal overload (for example, an overload that only occurs seasonally), and a long secondary line (for example, a connection from the distribution transformer to the end user premises). Each of these anomalies can result in an identifiable voltage signature at an end user premises.

Accordingly, advantages of certain aspects include early identification of electrical anomalies, which can help with failure avoidance, improved system efficiency, and improved system reliability in the form of improved System Average Interruption Frequency Index (SAIFI) or System Average Interruption Duration Index (SAIDI) scores. For example, once an anomaly is identified, actions can be proactively taken to resolve the source of the anomaly and avoid an unplanned outage, resulting in these advantages.

Additionally or alternatively, having identified an electrical anomaly, disclosed systems can retroactively analyze metering data from one or more meters and determine additional patterns that indicate the anomaly. While an untrained machine learning model that is unaware of a voltage signature identifying an anomaly may not be able to identify such a pattern, a machine learning model that is aware of the voltage signature can be trained to identify such voltage signatures, In this respect, disclosed solutions can provide earlier warnings of a developing electrical problem. For example, armed with the ability to identify a voltage signature that matches a loose connection, a trained machine learning model can identify patterns in the data from the corresponding electrical meter months or years before the loose connection becomes a serious problem.

The following non-limiting example is provided for illustrative purposes. Voltage measurements are gathered at a metering device at a particular frequency (e.g. every fifteen minutes). Examples of suitable metering devices are smart meters or Advanced Metering Infrastructure (AMI) meters. The metering device transmits the voltage data over a communications network to a head end system, with or separately from metering data such as power consumption.

Continuing the example, the head end system receives the voltage measurements from the metering device and derives statistical data from the voltage measurements. For instance, statistical data, such as a daily average and a daily minimum voltage, are calculated over a time period (e.g., one month). This statistical data is provided to a machine learning model. The machine learning model, previously trained to detect one or more anomalies from voltage data and/or derived statistics, determines a presence of an anomaly such as a loose connection or seasonal overload.

Figure 2:
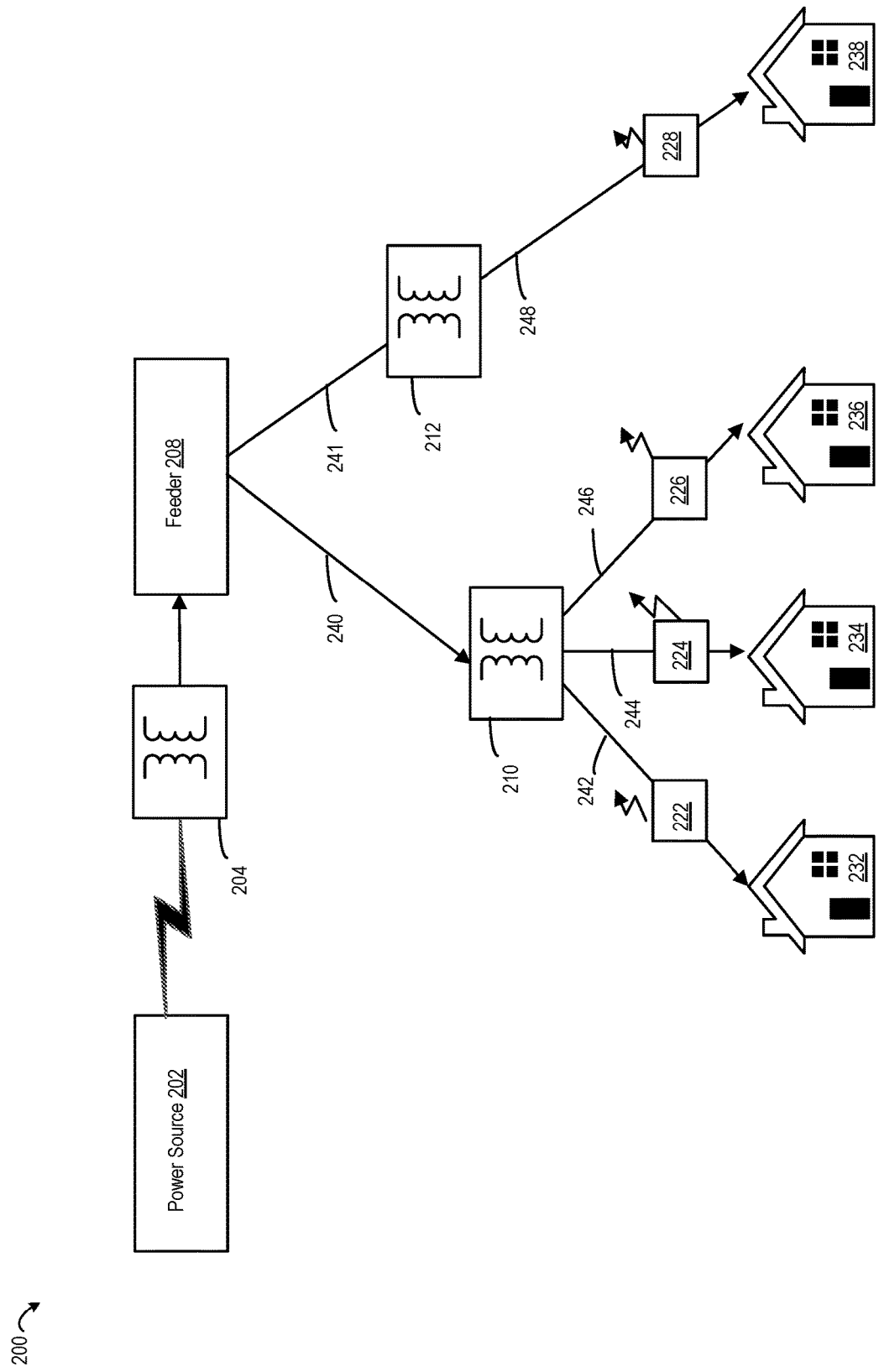
FIG. 2 illustrates an exemplary power distribution network, in accordance with an aspect of the present disclosure.

Turning now to the figures, FIG. 1 illustrates an exemplary communication network topology of a power distribution system, in accordance with an embodiment. FIG. 1 includes head end system 100; network connection 108; collector 110; network connections 112, 114, 116, and 118; metering devices 122, 124, 126, and 128; and end user premises 132, 134, 136, and 138. The communication network topology shown in FIG. 1 depicts an example of how various devices are interconnected in a communication network. The communication network topology is distinct from how power is distributed, as depicted in FIG. 2.

In the example depicted in FIG. 1, one or more of metering devices 122, 124, 126, and 128 measure one or more parameters such as voltage measurements, current measurements, phase measurements, real power consumption (watt-hours), real power (watts) and provide the parameters via network connections 112, 114, 116, and 118 to collector 110. In turn, collector 110 provides the metering data to head end system 100. Head end system 100 then processes the data to detect anomalies using machine learning.

Figure 6:
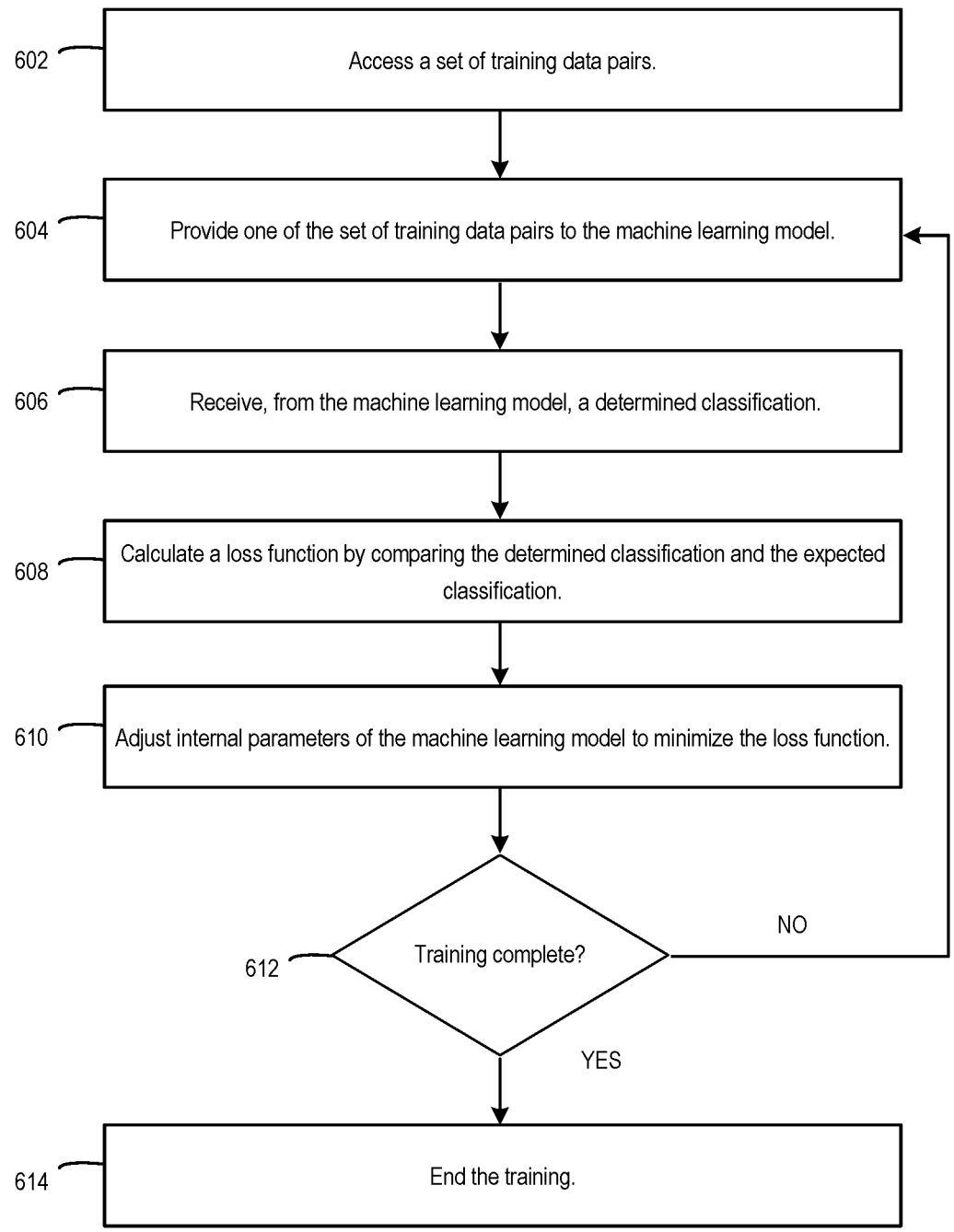
FIG. 6 depicts a flowchart of an exemplary process for training a machine learning model using supervised learning to detect anomalies, in accordance with an aspect of the present disclosure.
Figure 7:
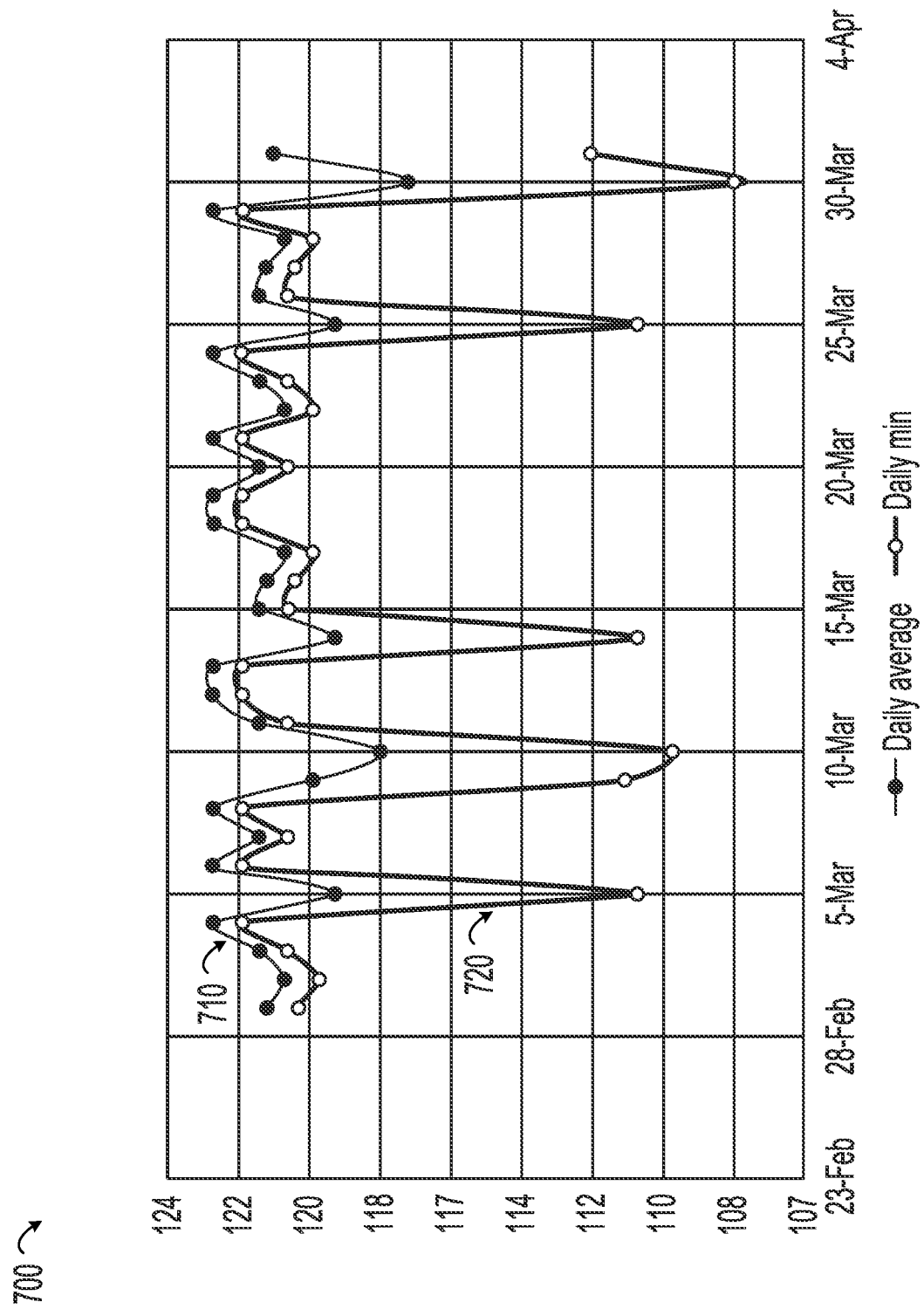
FIG. 7 depicts a graph indicating voltage measurements associated with a loose connection, in accordance with an aspect of the present disclosure.
Figure 8:
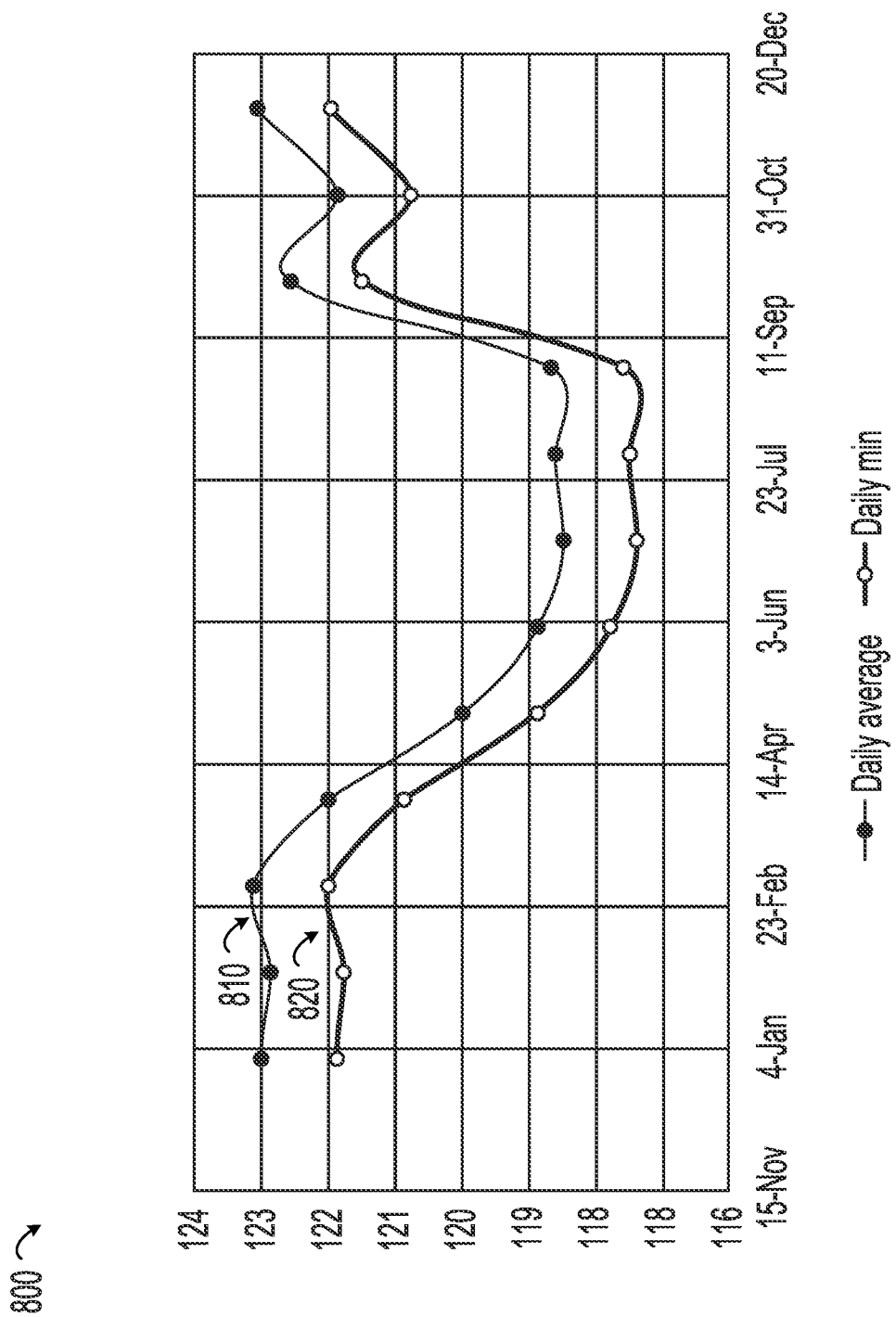
FIG. 8 depicts a graph indicating voltage measurements associated with a seasonal overload, in accordance with an aspect of the present disclosure.

Head end system 100 includes computing device 102 and machine learning model 104. An example of a computing device is depicted with respect to FIG. 9. Computing device 102 can derive statistics from voltage data gathered by metering devices 122, 124, 126, and 128 and/or provide the statistics to machine learning model 104, which in turn can identify one or more electrical anomalies at metering devices 122, 124, 126, and 128. Examples of anomalies that can be detected by machine learning model 104 include a loose connection (e.g., of a meter socket), a seasonal overload, and an excess voltage drop due to a long secondary distribution line. Exemplary voltage signatures that can signify these conditions are depicted in FIGS. 6, 7, and 8 respectively.

Metering devices 122, 124, 126, and 128 are located at end user premises 132, 134, 136, and 138 respectively. Metering devices 122, 124, 126, and 128 can each include a computing device, memory, other storage capabilities, and one or more network connections. Metering devices 122, 124, 126, and 128 can detect any parameters related to the distribution of electric power, for example, voltage, load, current, power consumption, or volt-ampere reactive (VAR) power. In some cases, individual metering devices 122, 124, 126, and 128 can push the voltage measurements to the head end system 100. In other cases, the head end system can pull the voltage measurements from the metering devices 122, 124, 126, and 128. In another aspect, the metering devices 122, 124, 126, and 128 can be configured to push the voltage measurements to the head end system 100 at a specific frequency, which can be different from a frequency of transmission of metering data (e.g., power consumption data). For instance, metering devices 122, 124, 126, and 128 can measure voltage at specific intervals such as every 15 minutes or every hour but can push power consumption data daily or monthly.

The functionality discussed with respect to head end system 100 can be implemented on any combination of the head end system 100 (e.g., computing device 102), one or more of metering devices 122, 124, 126, and 128, and a cloud-based system (i.e., a server connected via a persistent network connection). Examples of systems include AMI system and a meter data management (MDM) system.

For example purposes, network connection 108 is depicted as a wired network connection whereas network connections 112, 114, 116, and 118 are depicted as wireless network connections. Examples of typical networks include wireless (e.g., WiFi, Bluetooth, mesh, or cellular) and wired (e.g., Ethernet or power line communications) networks. But different configurations are possible. For instance, metering devices 122, 124, 126, and 128 can communicate with each other and/or head end system 100 using any communication networks. Communications can also be sent from head end system 100 to metering device 122, 124, 126, and 128. In some configurations, collector 110 may not be present and metering devices 122, 124, 126, and 128 communicate directly with the head end system 100.

FIG. 2 illustrates an exemplary power distribution network, in accordance with an aspect of the present disclosure. In the example depicted in FIG. 2, power distribution system 200 includes a power source 202; a power distribution substation transformer 204; a feeder 208; distribution transformers 210 and 212; power distribution primary lines 240 and 241, secondary lines 242, 244, 246, and 248; metering devices 222, 224, 226, and 228; and end user premises 232, 234, 236, and 238.

One example of power source 202 is a reduced representation of a the bulk power system to which a power distribution substation transformer 204 is connected, which includes the power sub-transmission network, power transmission network, and power generation sources (e.g., power plant, a solar panel, or a wind turbine generator). Power distribution substation 204 transforms the voltage output from the power source 202 to a suitable level for a feeder 208. The feeder 208 in turns feeds distribution lines 240 and 241. Power distribution substation 210 transforms the voltage of distribution line 240 into a different voltage in secondary lines 242, 244, and 246. Similarly, distribution transformer 212 transforms the voltage of distribution line 241 into a different voltage in secondary line 248.

As depicted, metering devices 222, 224, 226, and 228 correspond to end user premises 232, 234, 236, and 238 respectively. Metering devices 222, 224, 226, and 228 can correspond to metering devices 122, 124, 126, and 128 respectively. End user premises 232, 234, 236, and 238 can correspond to end user premises 132, 134, 136, and 138 respectively.

Metering device 222 measures parameters on secondary line 242, metering device 224 measures parameters on secondary line 244, metering device 226 measures parameters on secondary line 246, and metering device 228 measures parameters on secondary line 248. Because the length of each distribution line can be different, in some cases, an anomaly can occur due to a long secondary line. For instance, secondary line 248 may be longer than typical, resulting in an abnormally high voltage drop between distribution transformer 212 and end user premises 238. This anomaly can be identified by machine learning model 104.

In some examples, a metering device may be associated with a power distribution secondary line distributing one or more phases of a multi-phase distribution system. For example, power distribution secondary lines 242 may include two phases of a three-phase power generation and distribution system. In this configuration, using voltage measurements obtained at metering device 222, head end system 100 can determine that the different phases have different average and/or minimum voltages by providing measured voltages and/or statistics derived therefrom to machine learning model 104.

Figure 3:
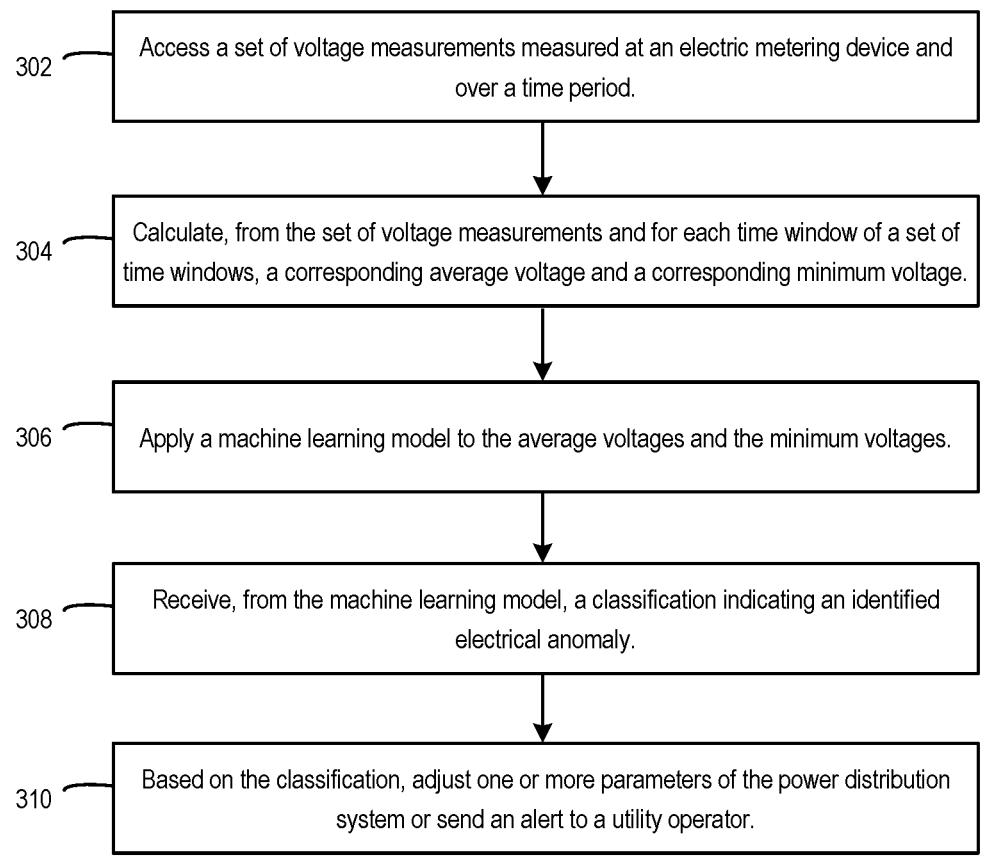
FIG. 3 depicts a flowchart of an exemplary process for using a machine learning model to detect anomalies, accordance with an aspect of the present disclosure.

FIG. 3 depicts a flowchart of an exemplary process 300 for using a machine learning model to detect anomalies, accordance with an aspect of the present disclosure. For example purposes, process 300 is discussed as being performed by head end system 100. But process 300 can be implemented on any computing device, for example, in a metering device.

At block 302, process 300 involves accessing a set of voltage measurements measured at a metering device and over a time period. For instance, head end system 100 accesses voltage measurements obtained from metering device 122. Accessing the voltage measurements can include transmitting a request to the electric metering device and receiving the voltage measurements back from the electric metering device. In another example, an electric metering device can periodically transmit the voltage measurements to the head end system. For example purposes, process 300 is discussed with respect to FIG. 4.

Figure 4:
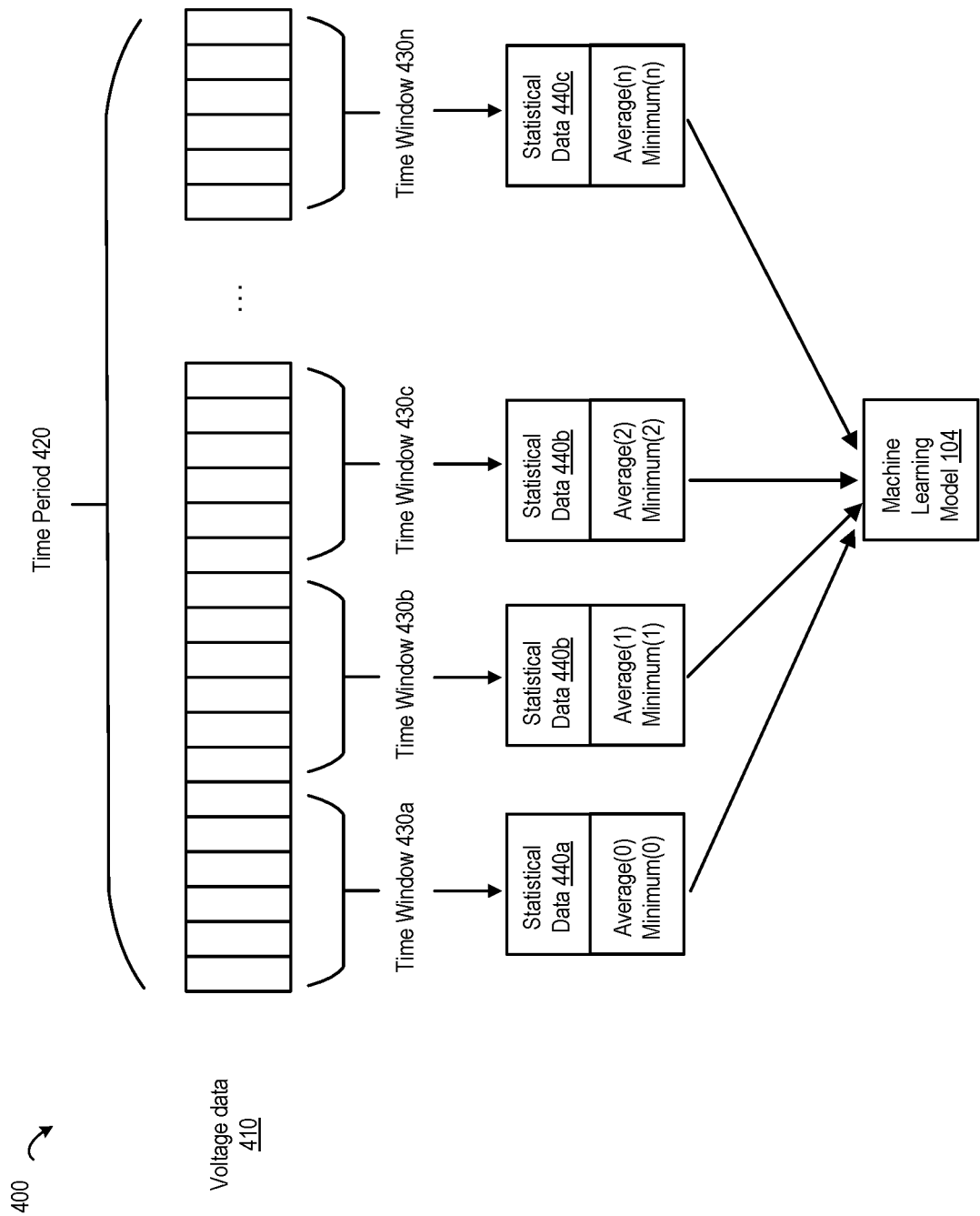
FIG. 4 depicts calculating statistical voltage data obtained from a metering device, in accordance with an aspect of the present disclosure.

FIG. 4 depicts calculating statistical voltage data obtained from a metering device, in accordance with an aspect of the present disclosure. FIG. 4 depicts data flow 400, which depicts how average and minimum voltage data are derived for various time periods from data obtained by a single metering device. Data flow 400 includes voltage data 410, which is obtained over a time period 420, time windows 430a-n, statistical data 440a-n, and machine learning model 104. Any length time period and any length time window can be used.

Continuing the example, computing device 102 accesses voltage data 410, which corresponds to time period 420, and separates the voltage data 410 into multiple time windows 430a-n. Time windows 430a-n are smaller than time period 420. Each of time window 430a-n includes multiple voltages. For instance, if a particular time window is one day, and the frequency at which voltages were obtained is every fifteen minutes, then one time window would include ninety-six voltage measurements. In an example, time period 420 is a month and time windows 430a-n are each one day. For example, time window 430a is a first day, time window 430b a second day, and so forth.

Returning to FIG. 3, at block 304, process 300 involves calculating, from the set of voltage measurements and for each time window of a set of time windows, a corresponding average voltage and a corresponding minimum voltage. Continuing the example, computing device 102 computes statistical data 440a-n from time windows 430a-n. More specifically, computing device 102 computes statistical data 440a, which includes an average and a minimum from time window 430a, and statistical data 440b, which includes an average and a minimum from time window 430b, and so forth.

While averages and minimums are discussed with respect to FIG. 4, other statistical metrics such as median, mode, maximums, etc. derived from voltages or other parameters can be used by machine learning model 104. In this case, machine learning model 104 is trained using these statistics.

At block 306, process 300 involves applying a machine learning model to the average voltages and the minimum voltages for the time period. Continuing the example, computing device 102 provides statistical data 440a-n to machine learning model 104.

Machine learning model 104 is trained to identify one or more electrical anomalies from voltages, as discussed further with respect to FIG. 6. In some cases, one or more of the average voltages and the minimum voltages are translated into one or more feature vectors. A feature vector is a vector containing multiple elements about an object (for example, an electrical meter). The feature vector can therefore include average voltages, minimum voltages, or other statistics. The feature vectors are in turn provided, one or more at a time, to machine learning model 104.

At block 308, process 300 involves receiving, from the machine learning model, a classification indicating an identified electrical anomaly. Continuing the example, machine learning model 104 outputs a classification that identifies an electrical anomaly. Examples of anomalies include a loose connection to the power line at an end user premises, a seasonal overload in consumption, and a voltage drop caused by a long secondary line (connection from the distribution transformer to the end user premises.

One example of an anomaly is a loose connection associated with the electric metering device, as discussed further with respect to FIG. 6. A loose connection can be represented by a first decrease in a minimum voltage over the time period and a second decrease in average voltage over the time period, in which the second decrease is less than the first decrease.

Another example of an anomaly is a seasonal overload caused by power consumption measured by the electric metering device, as discussed further with respect to FIG. 7. Such an anomaly can be represented by one or more correlations between one or more peaks or valleys of the minimum voltages with one or more peaks or valleys of the average voltages.

Machine learning model 104 can output classifications of one or more specific anomalies. In other cases, machine learning model 104 can output a determined probability of one or more classifications. For instance, machine learning model 104 may output a first probability that the voltages indicate a loose connection of 80% and a probability of 20% that a loose connection does not exist. In other cases, a set of probabilities may be generated such as a probability of 50% of a loose connection, 40% of a long secondary line, and 10% that neither anomaly exists. A machine learning model that generates a particular classification (e.g., positive or negative) may be a different type of model than a machine learning model that generates a range of probabilities.

The output of machine learning model 104 is provided to computing device 102. In some cases, computing device 102 can make a determination that when the probability is above a certain threshold, the corresponding classification is used. In some cases, computing device 102 can determine that when the probability is below the threshold, no classification is made.

At block 310, process 300 involves, based on the classification, sending an alert to a utility operator or adjusting one or more parameters of the power distribution system. For instance, computing device 102 can send an alert to a utility operator or send an alert to an engineer to visit a customer premises to perform a repair such as replacing a bad meter socket or meter. As a result, an electrical load on a line can be rebalanced, additional equipment can be added, or equipment (e.g. a transformer) can be replaced.

In another example, at block 310, computing device 102 can cause head end system 100 to adjust one or more parameters of the power distribution system. Examples of parameters that can be adjusted include line voltage, phase, load, reactance, capacitance, and so forth. In some cases, such adjustments can be performed remotely via a communications network, for example by communicating with a resource regulation device, which in turn makes the adjustments.

In an aspect, data from multiple metering devices can be analyzed by machine learning model 104. For instance, process 300 may be executed multiple times, once for each metering device. Alternatively, blocks 302-304 may be executed multiple times, once for each metering device, and then data from multiple metering devices is analyzed in aggregate form by machine learning model 104, e.g., at block 308. This analysis could occur in real-time or after a threshold amount of data has been buffered.

In an example, head end system 100 accesses voltage measurements from two or more metering devices. Head end system 100 calculates statistical metrics for each of the metering devices and for each of the voltage measurements and for each time window. Head end system 100 then applies machine learning model 104 to the statistical metrics. In some cases, applying can result in an adjustment of the training of the machine learning model. Continuing the example, head end system 100 identifies one or more anomalies with one or more electrical metering devices.

In some cases, the machine learning model can use topology information of the electric metering devices. For instance, given topography information (e.g., as depicted in FIG. 2), machine learning model 104 can determine whether an anomaly exists at one metering device but not on another metering device. From this determination, the machine learning model 104 can identify a problem on another component such as a distribution transformer. For example, if a particular anomaly is shown on metering device 222, 224, and 226, but not on metering device 228, then an anomaly may exist on distribution transformer 210 or distribution line 240.

Figure 9:
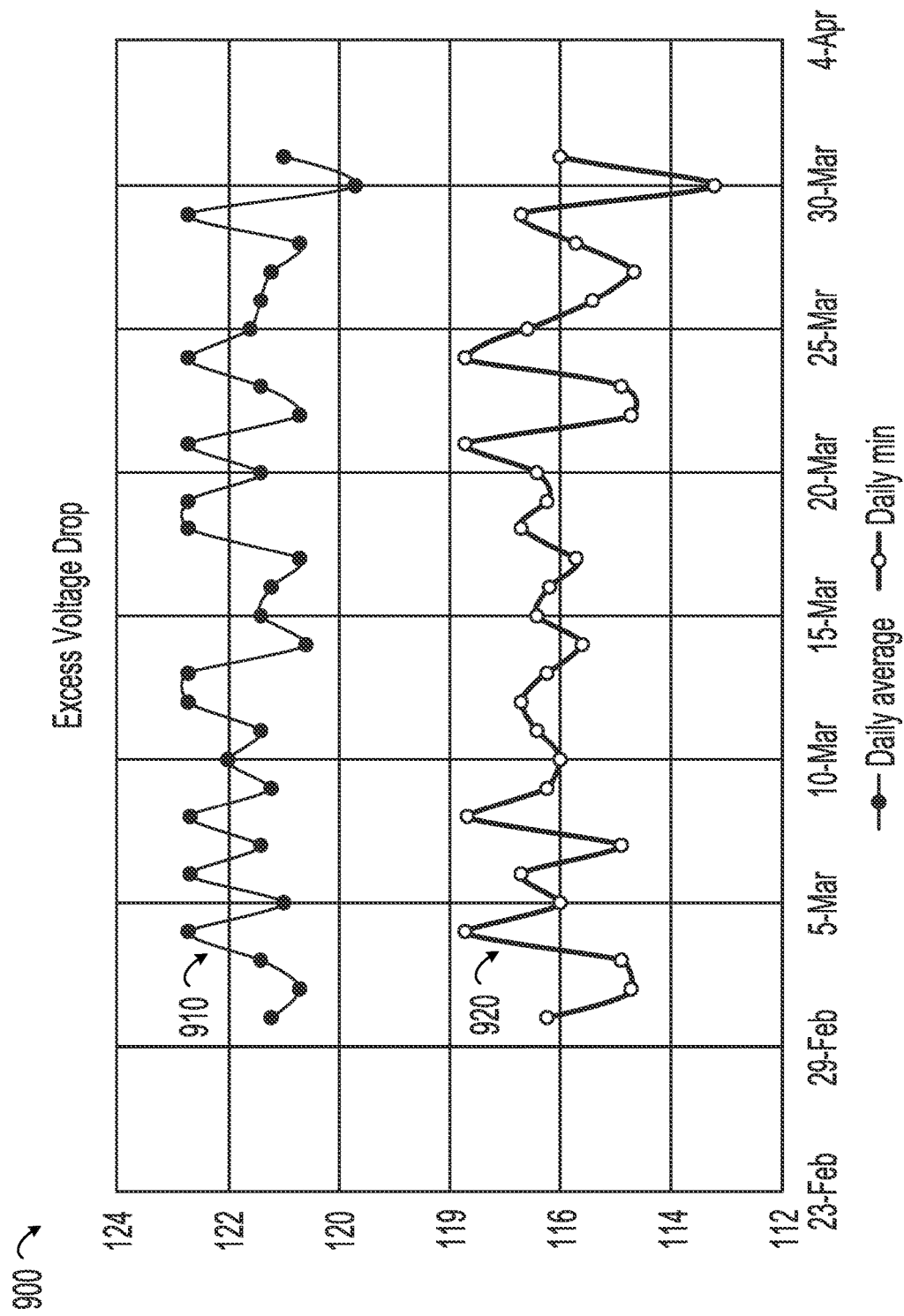
FIG. 9 depicts a graph indicating voltage measurements associated with an excess voltage drop due to a long secondary line, in accordance with an aspect of the present disclosure.

As discussed further with respect to FIG. 9, another example of an anomaly is an excess voltage drop due to a long distribution line associated with the electric metering device. In some cases, determining this excess voltage drop involves collecting measurements from additional electric meters. For instance, the topology of such an electrical network may be that one or more distribution transformers are electrically connected to and upstream from a subset of electric metering devices via a distribution line. One identifiable anomaly can be identified by a difference between an average voltage of a subset of electrical metering devices and a daily average of a single electric metering device being above a threshold.

Figure 5:
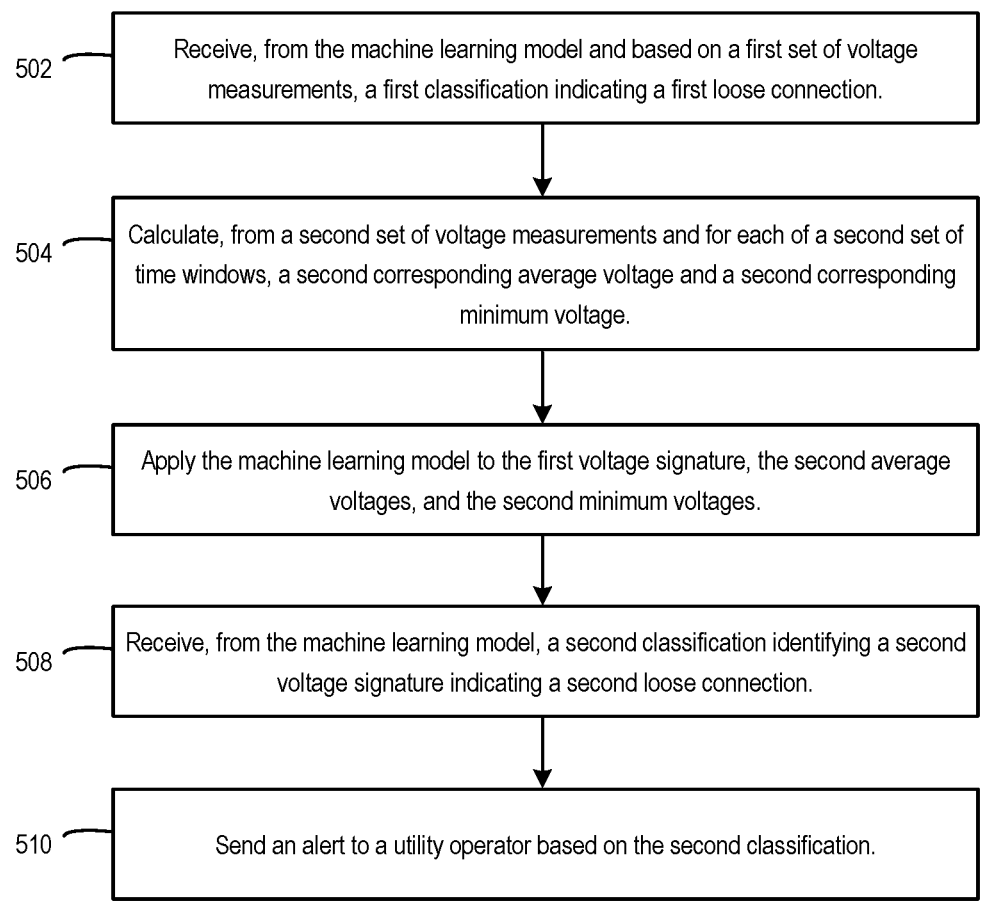
FIG. 5 depicts a flowchart of an exemplary process for using a machine learning model to detect anomalies, accordance with an aspect of the present disclosure.

FIG. 5 depicts a flowchart of an exemplary process 500 for using a machine learning model to detect anomalies, accordance with an aspect of the present disclosure. Relative to process 300 discussed with respect to FIG. 3, process 500 involves using a first identification of an anomaly (optionally including associated voltage data) in conjunction with machine learning to identify a second identification of an anomaly. The second identification of an anomaly can correspond to an anomaly that occurred earlier in time within the data than the first identification.

For instance, process 500 can detect a loose connection in a first set of voltage data, then use the detected voltage signature in the same or a different machine learning model to identify a second voltage signature in statistical data (e.g., voltage data) originating from the same electrical meter or different electrical meters. For example, a loose connection may have been present for a while but not detected until the first classification. Given the first classification, earlier identification may be possible retroactively and/or on a different set of data.

At block 502, process 500 involves receiving, from the machine learning model and based on a first set of voltage measurements, a first classification indicating a first loose connection. At block 502, process 500 involves similar operations as discussed with respect to blocks 302-308 of process 300. The classification can include a voltage signature. Process 500 can optionally involve sending an alert to a utility operator based on the first classification, as discussed with respect to block 310 of process 300.

At block 504, process 500 involves calculating, from a second set of voltage measurements and for each of a second set of time windows, a second corresponding average voltage and a second corresponding minimum voltage. At block 504, process 500 involves similar operations as discussed with respect to block 304 of process 300. The second set of voltages can be from the same electric meter from which the voltage data used at block 502 originated and/or can originate from different electric meter(s). The second set of voltages can originate occur before the first set of time windows (e.g., as discussed with respect to block 304 of process 300).

At block 506, process 500 involves applying the machine learning model to the first voltage signature, the second average voltages, and the second minimum voltages. Continuing the example, computing device 102 provides one or more of the first voltage signature (e.g., identified at block 502), the first average and minimum voltages (e.g., identified at block 502), the second average voltages, and the second minimum voltages to the machine learning model 104. In some cases, a different machine learning model can be used than was used at block 502. The machine learning models can be trained to identify one or more electrical anomalies from voltages, as discussed further with respect to FIG. 6.

At block 508, process 500 involves receiving, from the machine learning model, a second classification identifying a second voltage signature indicating a second loose connection. Continuing the example, computing device 102 receives a second classification that identifies a second voltage signature. The second voltage signature can be identical, similar, or different from the first voltage signature.

At block 510, process 500 involves sending an alert to a utility operator based on the second classification. At block 510, process 500 involves similar operations as discussed with respect to block 310 of process 300.

Machine learning model 104 is trained to detect one or more predetermined voltage signatures that each correspond to one or more anomalies. Different learning techniques can be used such as supervised learning (e.g., with labeled training data), unsupervised learning (e.g., no labels), or reinforcement learning. Training can be performed by head end system 100, e.g., computing device 102, or different computing system. In the case that training is performed by different computing system, then machine learning model 104 can be provided (e.g., downloaded) to head end system 100 and/or updated as necessary.

In some cases, training can be performed at runtime. For instance, an operator can indicate that a classification or prediction of an anomaly is correct or incorrect and provide feedback to the computing device 102, which in turn updates machine learning model 104 accordingly.

During training, the machine learning model learns an algorithm to identify electrical anomalies. While FIG. 6 is discussed with respect to supervised learning, other learning techniques can be used. Additionally, the trained machine learning algorithm can be improved over time, for instance by additional training at runtime.

FIG. 6 depicts a flowchart of an exemplary process 600 for training a machine learning model using supervised learning to detect anomalies, in accordance with an aspect of the present disclosure. In the supervised learning approach, a determined probability or classification is calculated and compared with an expected, or known, probability or classification. A loss function is calculated from the comparison. Based on the calculated loss function, machine learning model 104 adjusts internal parameters of the machine learning model to minimize the loss function. Examples of suitable machine learning models include neural networks, classifiers, and decision trees.

At block 602, process 600 involves accessing a set of training data pairs. Each training data pair comprises statistics (e.g., a set of average voltages and a set of minimum voltages for a time period) and an expected classification that indicates one or more electrical anomalies. Each of the training data pairs include data that is previously identified as part of a positive training set (i.e., corresponding to voltage data that corresponds to a previously identified voltage signature) and/or a negative training set (i.e., voltage data that does not correspond to the previously identified voltage signature). Process 600 is discussed as performed by computing device 102. However, training can be performed by any computing system.

At block 604, process 600 involves providing one of the set of training data pairs to the machine learning model. Continuing the example, computing device 102 provides a training data pair of the training data pairs to machine learning model 104.

At block 606, process 600 involves receiving, from the machine learning model, a determined classification. Continuing the example computing device 102 receives, from machine learning model 104, a determined classification.

At block 608, process 600 involves calculating a loss function by comparing the determined classification and the expected classification. Continuing the example, computing device 102 calculates a loss function by comparing the determined classification (i.e., received at block 606) and the expected classification (i.e., included in the training data pair accessed at block 604).

At block 610, process 600 involves adjusting internal parameters of the machine learning model to minimize the loss function. Continuing the example, computing device 102 adjusts the machine learning model 104 as appropriate.

At block 612, process 600 involves checking whether the training is complete. If the training is complete, then process 600 continues to block 614, where the training ends. If the training is not complete, then process 600 returns to 604 and uses another training data pair to continue to train the machine learning model. Completion of the training can be indicated by an end to the training data, the loss function being minimized below a threshold level, or some other condition.

In an aspect, machine learning model 104 is trained to detect multiple voltage signatures. In this case, machine learning model 104 can identify an electrical signature that is indicative of more than one electrical anomaly. For instance, machine learning model 104 could identify a loose socket connection and a seasonal overload. In this case, process 600 can be completed one or more times for each electrical anomaly.

In a further aspect, machine learning model 104 is tested to ensure sufficient accuracy in classification of electrical anomalies. Typically, data used to test machine learning model 104 is not included in the data set used to train machine learning model (i.e., the training data pairs).

In another aspect, machine learning model 104 can be trained in an unsupervised manner using historical data from metering devices. Historical data can include data from time period prior to the time period for which an initial identification of a defect was made. For instance, after a particular metering device is identified as presenting an anomaly (e.g. by analyzing voltages from the metering device as described in process 300), computing device 102 and/or machine learning model 104 can analyze additional data from the metering device to determine whether any additional voltage signatures exist. For instance, a signature could be identified in historical data and subsequently, an earlier time at which a defect occurred can be identified. Using this approach, machine learning model 104 can identify one or more precursor patterns in gathered voltage data, potentially earlier than previously detectable using supervised techniques (e.g., process 600).

In a more detailed example, process 300 is used to identify five metering devices with loose connections. For instance, a month of historical voltage data is processed by process 300. The five metering devices are fixed by a service person tightening screws on the bases of the metering devices. This process of identifying metering devices with loose connections can continue.

Continuing the example, after several months, twenty meters are identified and remedied. But historical data for each meter over a period of a year for each of the metering devices is available. By training the machine learning model 104 with this historical data, machine learning model 104 identifies one or more additional precursor signatures that are common to all of the twenty meters. Such identified signatures can supplement and/or replace the signatures identified in process 500. In this manner, training can continue over time, in an unsupervised or supervised fashion. Benefits of this continued training approach include identification of voltage signatures that can occur at unpredictable or unexpected times, thereby improving machine learning model 104.

FIG. 7 depicts a graph indicating voltage measurements associated with a loose connection, in accordance with an aspect of the present disclosure. Graph 700 depicts a daily average voltage 710 and a daily minimum voltage 720 measured by a metering device at an end user premises. Data corresponding to graph 700 is shown below in Table 1.

As can be seen in graph 700, large differences between the daily average voltage 710 and the daily minimum voltage 720 can exist at certain points. These differences indicate an arcing of a connection or frequent disconnections at the connection. Together, the measurements in graph 700 can form a voltage signature that indicates a loose socket connection. For instance, the size of the dips in minimum voltage 720 relative to the average voltage 710 can indicate a loose connection. Machine learning model 104 is trained to identify these signatures as anomalies.

TABLE 1 data indicating a loose connection

| Date | Daily average (Volts) | Daily minimum (Volts) |
|---|---|---|
| 1-Mar | 121.2 | 120.3 |
| 2-Mar | 120.7 | 119.7 |
| 3-Mar | 121.4 | 120.6 |
| 4-Mar | 122.7 | 121.9 |
| 5-Mar | 119.3 | 110.7 |
| 6-Mar | 122.7 | 121.9 |
| 7-Mar | 121.4 | 120.6 |
| 8-Mar | 122.7 | 121.9 |
| 9-Mar | 119.9 | 111 |
| 10-Mar | 118 | 109.7 |
| 11-Mar | 121.4 | 120.6 |
| 12-Mar | 122.7 | 121.9 |
| 13-Mar | 122.7 | 121.9 |
| 14-Mar | 119.3 | 110.7 |
| 15-Mar | 121.4 | 120.6 |
| 16-Mar | 121.2 | 120.4 |
| 17-Mar | 120.7 | 119.9 |
| 18-Mar | 122.7 | 121.9 |
| 19-Mar | 122.7 | 121.9 |
| 20-Mar | 121.4 | 120.6 |
| 21-Mar | 122.7 | 121.9 |
| 22-Mar | 120.7 | 119.9 |
| 23-Mar | 121.4 | 120.6 |
| 24-Mar | 122.7 | 121.9 |
| 25-Mar | 119.3 | 110.7 |
| 26-Mar | 121.4 | 120.6 |
| 27-Mar | 121.2 | 120.4 |
| 28-Mar | 120.7 | 119.9 |
| 29-Mar | 122.7 | 121.9 |
| 30-Mar | 117.2 | 108 |
| 31-Mar | 121 | 112 |

FIG. 8 depicts a graph indicating voltage measurements associated with a seasonal overload, in accordance with an aspect of the present disclosure. Graph 800 depicts a daily average voltage 810 and a daily minimum voltage 820 measured by a metering device at an end user premises. Data for Graph 800 is shown below in Table 2. Here, the time period used is a year and the time period is a month.

The data shows voltage measurements from January to December. As can be seen, during April to September, there is a higher load as indicated by a lower voltage. These dips in voltage can form signatures that indicate a transformer being overloaded. For instance, the relative alignment of the peaks and valleys in the minimum voltage 820 relative to peaks and valleys of the average voltage 810 can indicate seasonal overload. Machine learning model 104 is trained to identify these signatures as anomalies.

TABLE 2 data indicating a seasonal overload

| Date | Daily average (Volts) | Daily minimum (Volts) |
|---|---|---|
| 1-Jan | 123 | 121.9 |
| 1-Feb | 122.9 | 121.8 |
| 1-Mar | 123.1 | 122 |
| 1-Apr | 122 | 120.9 |
| 1-May | 120 | 118.9 |
| 1-Jun | 118.9 | 117.8 |
| 1-Jul | 118.5 | 117.4 |
| 1-Aug | 118.6 | 117.5 |
| 1-Sep | 118.7 | 117.6 |
| 1-Oct | 122.6 | 121.5 |
| 1-Nov | 121.9 | 120.8 |
| 1-Dec | 123.1 | 122 |

FIG. 9 depicts a graph indicating voltage measurements associated with an excess voltage drop due to a long secondary line, in accordance with an aspect of the present disclosure. Graph 900 depicts a daily average voltage 910 of all the meters behind a service transformer (e.g., metering devices 222, 224, and 226) in comparison with a daily average voltage 920 measured by a metering device at an end user premises (metering device 226). Graph 900 is shown for one month of measurements, as shown below in Table 3.

As can be seen in graph 900, there exists a large separation between daily average voltage in all the meters behind a service transformer in comparison to the daily average voltage of the meter with the long secondary line. To recognize this signature some topology information is required. This topology information associates metering devices with transformers for the purpose of using voltages to recognize this particular pattern. Machine learning model 104 can recognize this signature by comparing the average voltage of all the metering devices that are behind the transformer with the daily average of each metering device.

TABLE 3 data indicating an excess voltage drop

| Date | Daily average of meters behind a transformer (Volts) | Daily average of one meter behind the transformer (Volts) |
| --- | --- | --- |
| 1-Mar | 121.2 | 116.2 |
| 2-Mar | 120.7 | 114.7 |
| 3-Mar | 121.4 | 114.9 |
| 4-Mar | 122.7 | 117.7 |
| 5-Mar | 121 | 116 |
| 6-Mar | 122.7 | 116.7 |
| 7-Mar | 121.4 | 114.9 |
| 8-Mar | 122.7 | 117.7 |
| 9-Mar | 121.2 | 116.2 |
| 10-Mar | 122 | 116 |
| 11-Mar | 121.4 | 116.4 |
| 12-Mar | 122.7 | 116.7 |
| 13-Mar | 122.7 | 116.2 |
| 14-Mar | 120.6 | 115.6 |
| 15-Mar | 121.4 | 116.4 |
| 16-Mar | 121.2 | 116.2 |
| 17-Mar | 120.7 | 115.7 |
| 18-Mar | 122.7 | 116.7 |
| 19-Mar | 122.7 | 116.2 |
| 20-Mar | 121.4 | 116.4 |
| 21-Mar | 122.7 | 117.7 |
| 22-Mar | 120.7 | 114.7 |
| 23-Mar | 121.4 | 114.9 |
| 24-Mar | 122.7 | 117.7 |
| 25-Mar | 121.6 | 116.6 |
| 26-Mar | 121.4 | 115.4 |
| 27-Mar | 121.2 | 114.7 |
| 28-Mar | 120.7 | 115.7 |
| 29-Mar | 122.7 | 116.7 |
| 30-Mar | 119.7 | 113.2 |
| 31-Mar | 121 | 116 |

Figure 10:
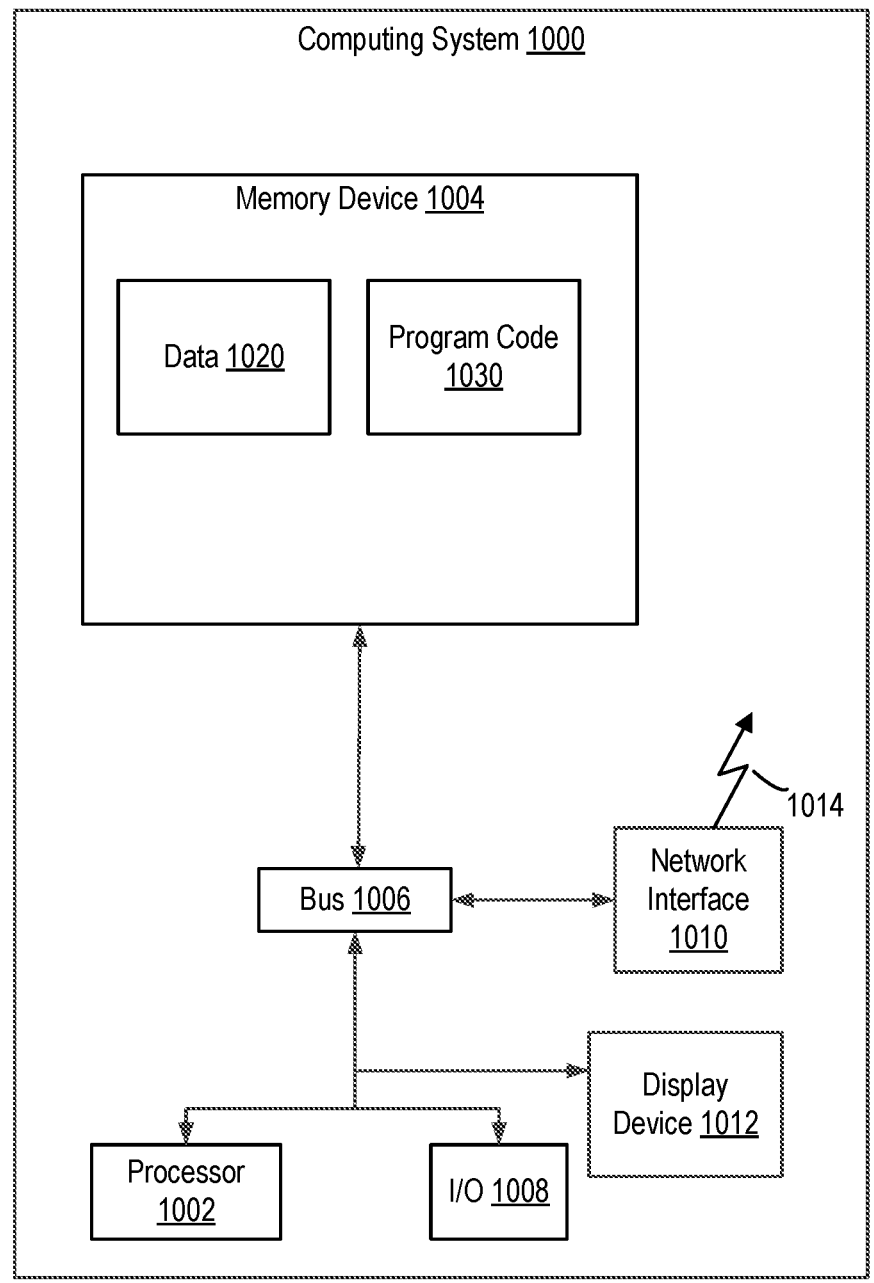
FIG. 10 illustrates an exemplary computing device, in accordance with an aspect of the present disclosure.

FIG. 10 illustrates an exemplary computing device, in accordance with an aspect of the present disclosure. Any suitable computing system may be used for performing the operations described herein. The depicted example of a computing device 1000 includes a processor 1002 communicatively coupled to one or more memory devices 1004. The processor 1002 executes computer-executable program code 1030 stored in a memory device 1004, accesses data 1020 stored in the memory device 1004, or both. Examples of the processor 1002 include a microprocessor, an application-specific integrated circuit ("ASIC"), a field-programmable gate array ("FPGA"), or any other suitable processing device. The processor 1002 can include any number of processing devices or cores, including a single processing device. The functionality of the computing device may be implemented in hardware, software, firmware, or a combination thereof.

In some aspects, computing device 1000 can include at least one sensor configured to measure parameters relating to the resource of a resource distribution network. For example, in an electricity distribution system, the sensor can measure power consumption, voltage, current, etc. In some aspects, the computing device 1000 may include multiple sensors. For example, a computing device 1000 may include both a power and a temperature sensor.

The memory device 1004 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a flash memory, a ROM, a RAM, an ASIC, or any other medium from which a processing device can read instructions. The instructions may include processor-specific instructions generated by a compiler or an interpreter from code written in any suitable computer-programming language, including, for example, C, C++, C#, Visual Basic, Java, or scripting language.

The computing device 1000 may also include a number of external or internal devices, such as input or output devices. For example, the computing device 1000 is shown with one or more input/output ("I/O") interfaces 1008. An I/O interface 1008 can receive input from input devices or provide output to output devices. One or more busses 1006 are also included in the computing device 1000. The bus 1006 communicatively couples one or more components of a respective one of the computing device 1000.

The computing device 1000 executes program code 1030 that configures the processor 1002 to perform one or more of the operations described herein.

The computing device 1000 also includes a network interface device 1010. The network interface device 1010 includes any device or group of devices suitable for establishing a wired or wireless data connection to one or more data networks. The network interface device 1010 may be a wireless device and have an antenna 1014. The computing device 1000 can communicate with one or more other computing devices implementing the computing device or other functionality via a data network using the network interface device 1010.

The computing device 1000 can also include a display device 1012. Display device 1012 can be a LCD, LED, touch-screen or other device operable to display information about the computing device 1000. For example, information could include an operational status of the computing device, network status, etc.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method of using machine learning to detect an electrical anomaly in a power distribution system, the method comprising:
accessing a first plurality of voltage measurements measured at an electric metering device;
calculating, from the first plurality of voltage measurements and for each of a first plurality of time windows, a first corresponding average voltage and a first corresponding minimum voltage;
training a machine learning model by:
accessing a set of training data pairs, wherein each training data pair comprises one or more of (i) a training set of average voltages and a set of minimum voltages, (ii) a training set of average voltages of all the electric metering devices connected to a distribution transformer, or (iii) a training set of average voltages of one electric metering device that is behind the distribution transformer and an expected classification that indicates one or more electrical anomalies;
providing one training data pair of the set of training data pairs to the machine learning model;
receiving, from the machine learning model, a determined classification;
calculating a loss function by comparing the determined classification and the expected classification; and
adjusting internal parameters of the machine learning model to minimize the loss function;
applying the machine learning model to the first average voltages and the first minimum voltages, wherein the machine learning model is trained to identify, from voltage measurements, a first voltage signature that corresponds to the electrical anomaly;
receiving, from the machine learning model, a first classification indicating a first loose connection;
based on the first classification, sending a first alert to a utility operator;
calculating, from a second plurality of voltage measurements and for each of a second plurality of time windows, a second corresponding average voltage and a second corresponding minimum voltage, wherein the second plurality of time windows occur before the first plurality of time windows;
applying the machine learning model to the first average voltages, the first minimum voltages, first voltage signature, the second average voltages, and the second minimum voltages;
receiving, from the machine learning model, a second classification identifying a second voltage signature indicating a second loose connection; and
based on the second classification, sending a second alert to the utility operator.

2. The method of claim 1, wherein the second plurality of voltage measurements are measured at an additional electric metering device.

3. The method of claim 1, wherein the first voltage signature includes a first decrease in a minimum voltage over a time period and a second decrease in average voltage over the time period, and wherein the second decrease is less than the first decrease.

4. The method of claim 1, wherein the second plurality of voltage measurements are measured at the electric metering device.

5. The method of claim 1, further comprising applying the machine learning model to topology information that associates the electric metering device with one or more distribution transformers that are electrically connected to the electric metering device via a distribution line.

6. The method of claim 1, wherein accessing the first plurality of voltage measurements comprises transmitting a request to the electric metering device and receiving the first plurality of voltage measurements from the electric metering device.

7. The method of claim 1, wherein the set of training data pairs further comprise topology information that associates one or metering devices with one or more distribution transformers.

8. A non-transitory computer-readable storage medium storing computer-executable program instructions, wherein when executed by a processing device, the computer-executable program instructions cause the processing device to perform operations comprising:
accessing a first plurality of voltage measurements measured at an electric metering device;
calculating, from the first plurality of voltage measurements and for each of a first plurality of time windows, a first corresponding average voltage and a first corresponding minimum voltage;
training a machine learning model by:
accessing a set of training data pairs, wherein each training data pair comprises one or more of (i) a training set of average voltages and a set of minimum voltages (ii) a training set of average voltages of all the electric metering devices connected to a distribution transformer, or (iii) a training set of average voltages of one electric metering device that is behind the distribution transformer and an expected classification that indicates one or more electrical anomalies;
providing one training data pair of the set of training data pairs to the machine learning model;
receiving, from the machine learning model, a determined classification;
calculating a loss function by comparing the determined classification and the expected classification; and
adjusting internal parameters of the machine learning model to minimize the loss function;
applying the machine learning model to the first average voltages and the first minimum voltages, wherein the machine learning model is trained to identify, from voltage measurements, a first voltage signature that corresponds to an electrical anomaly;
receiving, from the machine learning model, a first classification indicating a first anomaly;
based on the first classification, sending a first alert to a utility operator;
calculating, from a second plurality of voltage measurements and for each of a second plurality of time windows, a second corresponding average voltage and a second corresponding minimum voltage, wherein the second plurality of time windows occur before the first plurality of time windows;
applying the machine learning model to the first average voltages, the first minimum voltages, the second average voltages, and the second minimum voltages;
receiving, from the machine learning model, a second classification identifying a second voltage signature indicating a second anomaly; and
based on the second classification, sending a second alert to the utility operator.

9. The non-transitory computer-readable storage medium of claim 8, wherein one or more of the first anomaly and the second anomaly relate to a loose connection associated with the electric metering device.

10. The non-transitory computer-readable storage medium of claim 8, wherein one or more of the first anomaly and the second anomaly is represented by a first decrease in a minimum voltage over a time period and a second decrease in average voltage over the time period, and wherein the second decrease is less than the first decrease.

11. The non-transitory computer-readable storage medium of claim 8, wherein one or more of the first anomaly and the second anomaly is represented by one or more correlations between one or more peaks or valleys of the first minimum voltages with one or more peaks or valleys of the first average voltages.

12. The non-transitory computer-readable storage medium of claim 8, wherein when executed by a processing device, the computer-executable program instructions cause the processing device to apply the machine learning model to topology information that associates the electric metering device with one or more distribution transformers that are electrically connected to the electric metering device via a distribution line.

13. The non-transitory computer-readable storage medium of claim 8, wherein accessing the first plurality of voltage measurements comprises transmitting a request to the electric metering device and receiving the plurality of voltage measurements from the electric metering device.

14. A system for detecting an electrical anomaly in a resource distribution system, the system comprising:
a head end system comprising a computing device and a machine learning model; and
a plurality of electric metering devices, each electric metering device comprising a sensor, each electric metering device electrically connected to a distribution transformer that that is upstream of the respective electric metering device, and each electric metering device configured to:
obtain, from the respective sensor of the electric metering device, a respective plurality of voltage measurements; and
provide the respective plurality of voltage measurements to the head end system, wherein the head end system is configured to:
access a first plurality of voltage measurements measured at a first electric metering device of the plurality of electric metering devices;
calculate, from the first plurality of voltage measurements and for each of a first plurality of time windows, a first corresponding average voltage and a first corresponding minimum voltage;
train the machine learning model trained by:
accessing a set of training data pairs, wherein each training data pair comprises one or more of (i) a training set of average voltages and a set of minimum voltages, (ii) a training set of average voltages of all the electric metering devices connected to a distribution transformer, or (iii) a training set of average voltages of one electric metering device that is behind the distribution transformer and an expected classification that indicates one or more electrical anomalies;
providing one training data pair of the set of training data pairs to the machine learning model;
receiving, from the machine learning model, a determined classification;
calculating a loss function by comparing the determined classification and the expected classification; and
adjusting internal parameters of the machine learning model to minimize the loss function;
apply the machine learning model to the first average voltages and the first minimum voltages, wherein the machine learning model is trained to identify, from voltage measurements, a first voltage signature that corresponds to the electrical anomaly;
receive, from the machine learning model, a first classification indicating a first loose connection;
based on the first classification, send a first alert to a utility operator, wherein the first alert identifies the first electric metering device;
access a second plurality of voltage measurements measured at a second electric metering device of the plurality of electric metering devices;
calculate, from the second plurality of voltage measurements and for each of a second plurality of time windows, a second corresponding average voltage and a second corresponding minimum voltage, wherein the second plurality of time windows occur before the first plurality of time windows;
apply the machine learning model to the first average voltages, the first minimum voltages, the second average voltages, and the second minimum voltages;
receive, from the machine learning model, a second classification identifying a second voltage signature indicating a second loose connection; and
based on the second classification, send a second alert to the utility operator, wherein the alert identifies the second electric metering device.

15. The system of claim 14, wherein the head end system is further configured to further train the machine learning model the plurality of voltage measurements from at least one electric metering device.

16. The system of claim 14, wherein the head end system is further configured to:
apply, to the machine learning model, topology information that associates the plurality of electric metering devices with one or more distribution transformers that are electrically connected to and upstream of the plurality of electric metering devices via a distribution line, and
wherein the electrical anomaly is a difference between an average voltage of the plurality of electric metering devices and a daily average of the one of the plurality of electric metering devices being above a threshold.

17. The system of claim 14, wherein the first voltage signature includes a first decrease in a minimum voltage over a time period and a second decrease in average voltage over the time period, and wherein the second decrease is less than the first decrease.

18. The system of claim 14, wherein accessing the plurality of voltage measurements comprises transmitting a request to the respective electric metering device and receiving the plurality of voltage measurements from the respective electric metering device.

* * * * *